US008791524B2

(12) United States Patent
Ichinose et al.

(10) Patent No.: US 8,791,524 B2
(45) Date of Patent: Jul. 29, 2014

(54) METHOD FOR MANUFACTURING NONVOLATILE SEMICONDUCTOR MEMORY DEVICE AND NONVOLATILE SEMICONDUCTOR MEMORY DEVICE

(75) Inventors: Daigo Ichinose, Mie-ken (JP); Hanae Ishihara, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/422,068

(22) Filed: Mar. 16, 2012

(65) Prior Publication Data
US 2013/0069140 A1 Mar. 21, 2013

(30) Foreign Application Priority Data

Sep. 16, 2011 (JP) ................... 2011-203418

(51) Int. Cl.
*H01L 29/72* (2006.01)
*H01L 21/336* (2006.01)
(52) U.S. Cl.
USPC ...... 257/324; 257/326; 257/E21.42; 257/319; 365/185.18
(58) Field of Classification Search
USPC .......................... 257/295, 306, 303, 309, 324; 365/185.18, 185.27
See application file for complete search history.

(56) References Cited

U.S. PATENT DOCUMENTS

| | | | | |
|---|---|---|---|---|
| 7,983,084 B2 * | 7/2011 | Tokiwa et al. | ............ | 365/185.11 |
| 8,017,993 B2 * | 9/2011 | Kidoh et al. | .................. | 257/324 |
| 8,072,024 B2 * | 12/2011 | Ishikawa et al. | ............... | 257/324 |
| 8,120,961 B2 * | 2/2012 | Katsumata et al. | ...... | 365/185.18 |
| 8,299,521 B2 * | 10/2012 | Lee et al. | ........................ | 257/326 |
| 8,334,561 B2 * | 12/2012 | Fukuzumi et al. | ............. | 257/326 |
| 2010/0200908 A1 * | 8/2010 | Lee et al. | ........................ | 257/326 |
| 2010/0213537 A1 | 8/2010 | Fukuzumi et al. | | |
| 2010/0213538 A1 | 8/2010 | Fukuzumi et al. | | |

OTHER PUBLICATIONS

Office Action issued on Jan. 30, 2014 in the counterpart Japanese Patent Application No. 2011-203418 (with English Translation).

* cited by examiner

*Primary Examiner* — Steven Loke
*Assistant Examiner* — David Goodwin
(74) *Attorney, Agent, or Firm* — Oblon, Spivak, McClelland, Maier & Neustadt, L.L.P.

(57) ABSTRACT

According to one embodiment, a method is disclosed for manufacturing a nonvolatile semiconductor memory device. The method can includes forming a semiconductor layer containing an impurity and forming a pattern on the semiconductor layer. The method can include forming first insulating layers in a stripe shape from a surface of the semiconductor layer toward an inside and forming a first insulating film on the semiconductor layer and on the first insulating layers to form a stacked body including electrode layers on the first insulating film. The method can include forming a pair of holes in the stacked body and forming a space portion connected to a lower end of the holes. The method can include forming a memory film on a side wall of the holes. In addition, the method can include forming a channel body layer on a surface of the memory film.

4 Claims, 11 Drawing Sheets

METHOD FOR MANUFACTURING NONVOLATILE SEMICONDUCTOR MEMORY DEVICE AND NONVOLATILE SEMICONDUCTOR MEMORY DEVICE

CROSS-REFERENCE TO RELATED APPLICATIONS

This application is based upon and claims the benefit of priority from the prior Japanese Patent Application No. 2011-203418, filed on Sep. 16, 2011; the entire contents of which are incorporated herein by reference.

FIELD

Embodiments described herein relate generally to a method for manufacturing a nonvolatile semiconductor memory device and a nonvolatile semiconductor memory device.

BACKGROUND

There is a memory device in which memory cells are three-dimensionally aligned by forming a memory hole in a stacked body where a plurality of electrode layers functioning as control gates in the memory cells and a plurality of insulating layers are alternately stacked, forming a charge storage film on a side wall of the memory hole, and then providing silicon serving as a channel in the memory hole.

In this type of memory device, there is a U-shaped memory string structure that includes: a pair of columnar parts extending in a stacking direction of the stacked body including a plurality of electrode layers; and a coupling part embedded in a back gate and connecting the pair of columnar parts.

Before the formation of the stacked body including the electrode layers, a concave portion (a space portion) is formed in a foundation layer serving as the back gate, and a sacrifice film is embedded in the concave portion. After that, the stacked body including the electrode layers is formed on the foundation layer, then the holes in the columnar parts are formed, and the sacrifice film within the concave portion is removed by etching through the holes. That is, the formation of the U-shaped memory holes includes a process of forming the concave portion and a process of embedding the sacrifice film within the concave portion. After that, the charge storage films and channel body layers are formed within the holes and the concave portion, and thus a nonvolatile semiconductor memory device is formed. This type of nonvolatile semiconductor memory device becomes increasingly smaller. Therefore, in the formation of the memory cells, it is necessary to further enhance the processing accuracy in a photolithography process.

DETAILED DESCRIPTION

According to one embodiment, a method is disclosed for manufacturing a nonvolatile semiconductor memory device. The method can include forming a semiconductor layer containing an impurity element on a foundation layer. The method can include forming, on the semiconductor layer, a pattern where, as viewed in a direction perpendicular to a major surface of the semiconductor layer, an impurity-containing region in a stripe shape containing the impurity element and a to-be-etched region in a stripe shape having an impurity concentration lower than a concentration of the impurity-containing region are alternately aligned approximately perpendicular to a direction in which the impurity-containing region extends. The method can include forming a plurality of first insulating layers in a stripe shape in a direction of the alternate alignment from a surface of each of the impurity-containing region and the to-be-etched region toward an inside. The method can include forming a first insulating film on the semiconductor layer and on the first insulating layers to form a stacked body including a plurality of electrode layers on the first insulating film. The method can include forming a first slit extending in the direction of the alternate alignment and reaching each of the plurality of first insulating layers from a surface of the stacked body and a second slit arranged approximately parallel to the first slit and penetrating the stacked body, the first insulating film and the to-be-etched region. The method can include forming a second insulating layer within the first slit and forming a third insulating layer within the second slit. The method can include forming a pair of holes reaching the to-be-etched region and sandwiching the second insulating layer in the stacked body. The method can include forming a space portion connected to a lower end of each of the pair of holes by removing the to-be-etched region through the pair of holes in the semiconductor layer. The method can include forming a memory film on a side wall of each of the pair of holes and forming a fourth insulating layer on an inner wall of the space portion. In addition, the method can include forming a channel body layer on a surface of the memory film formed on the side wall of each of the pair of holes and the inner wall of the space portion.

Various embodiments will be described hereinafter with reference to the accompanying drawings. In the following description, like members are marked with like numerals, and the description of the described members is omitted as appropriate.

First Embodiment

Before a method for manufacturing a nonvolatile semiconductor memory device of the embodiment is described, an outline of the nonvolatile semiconductor memory device manufactured by this manufacturing method will first be described with reference to a schematic perspective view.

Figure 1:
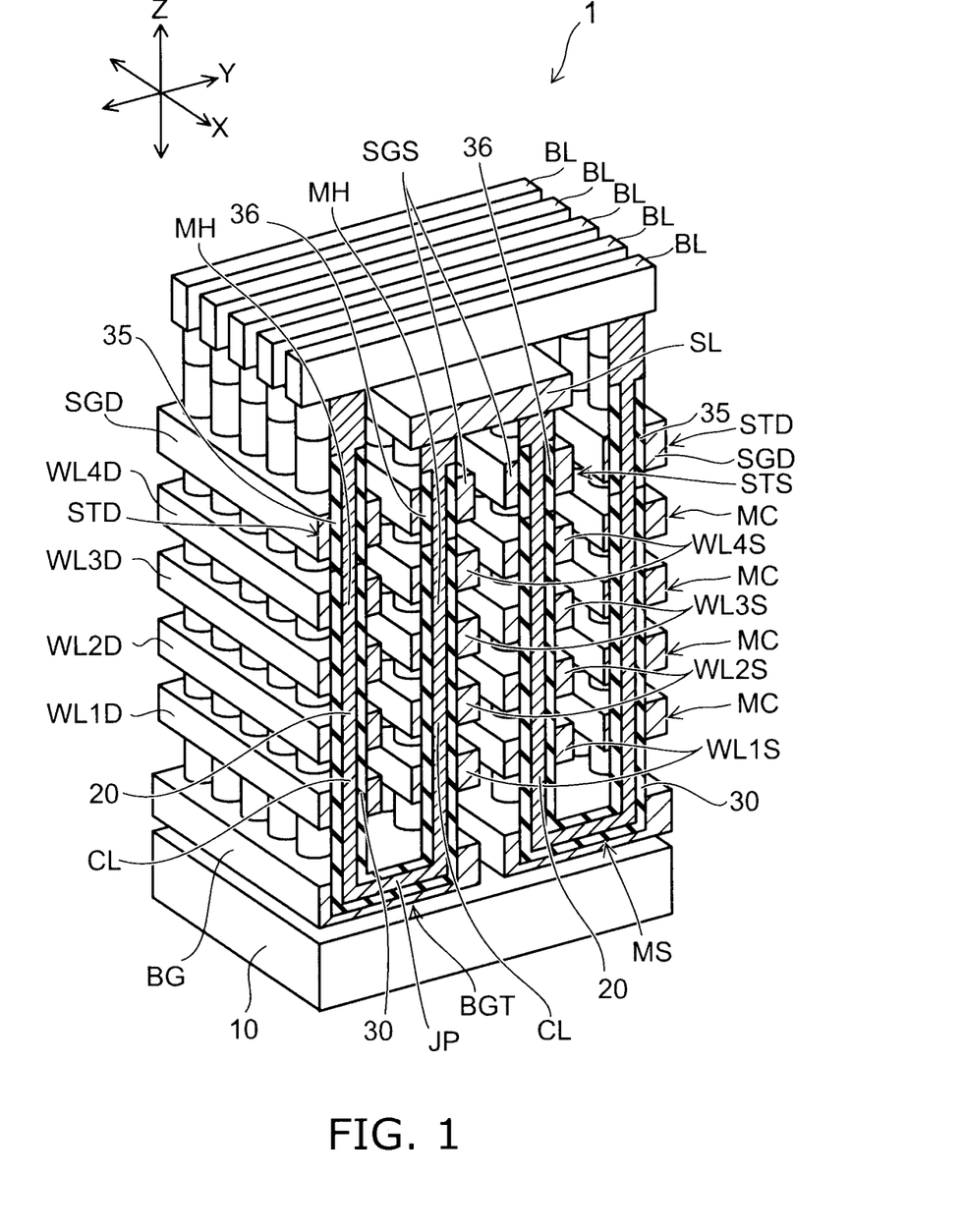
FIG. 1 is a schematic perspective view of a memory cell array of a nonvolatile semiconductor memory device according to a first embodiment.

FIG. 1 is a schematic perspective view of a memory cell array of the nonvolatile semiconductor memory device according to the first embodiment.

For ease of visibility, in FIG. 1, insulating portions other than insulating films formed on the inner walls of memory holes MH are not shown.

These insulting portions will be described by using FIG. 7B, which is a cross-sectional schematic view of the memory cell array.

Figure 2:
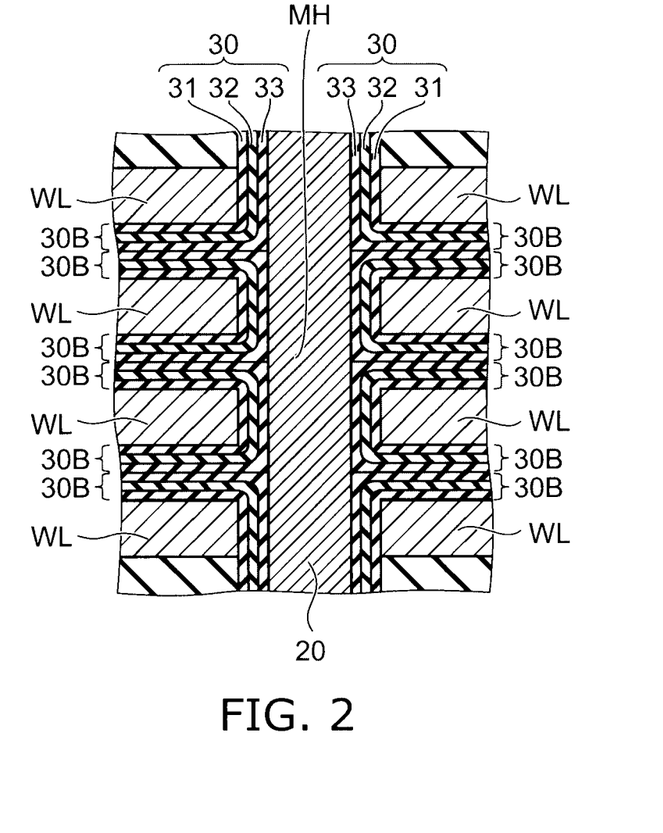
FIG. 2 is an enlarged cross-sectional view of a portion in which the memory cells of FIG. 1 are provided.

FIG. 2 is an enlarged cross-sectional view of a portion in which the memory cells of FIG. 1 are provided.

For convenience of description, in FIG. 1, an XYZ orthogonal coordinate system is introduced. In this coordinate system, two directions which are parallel to the major surface of a substrate 10 and which are perpendicular to each other are defined as an X-direction and a Y-direction, and a direction which is perpendicular to both of the X-direction and the Y-direction is defined as a Z-direction.

In the nonvolatile semiconductor memory device 1, a back gate BG is provided on the substrate 10 through an unillustrated insulating layer. The substrate 10 together with this insulating layer is referred to as a foundation layer. Within the substrate 10, an active element such as a transistor and a passive element such as a resistor or a capacitor may be provided. The back gate BG is, for example, a silicon (Si) layer having a conductivity, to which an impurity element is added. In FIG. 7B, a semiconductor layer (boron-added silicon layer) 11 corresponds to the back gate BG.

A plurality of insulating films 30B (refer to FIG. 2) and a plurality of electrode layers WL1D, WL2D, WL3D, WL4D, WL1S, WL2S, WL3S, and WL4S are alternately stacked on the back gate BG.

The electrode layer WL1D and the electrode layer WL1S are provided on the same layer and represent the first electrode layers from the bottom. The electrode layer WL2D and the electrode layer WL2S are provided on the same layer and represent the second electrode layers from the bottom. The electrode layer WL3D and the electrode layer WL3S are provided on the same layer and represent the third electrode layers from the bottom. The electrode layer WL4D and the electrode layer WL4S are provided on the same layer and represent the fourth electrode layers from the bottom.

The electrode layer WL1D is separated from the electrode layer WL1S in the Y-direction. The electrode layer WL2D is separated from the electrode layer WL2S in the Y-direction. The electrode layer WL3D is separated from the electrode layer WL3S in the Y-direction. The electrode layer WL4D is separated from the electrode layer WL4S in the Y-direction.

Figure 7A:
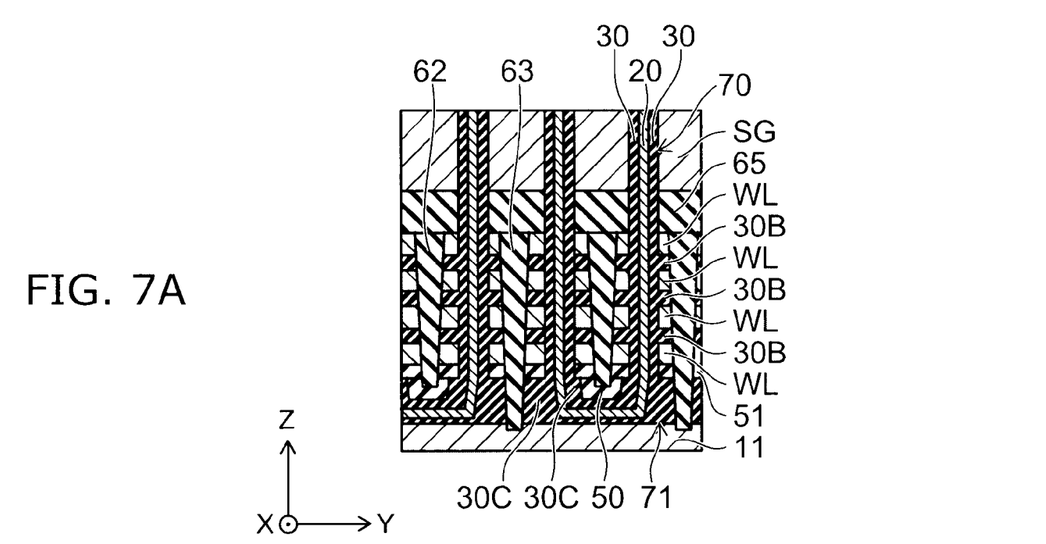
Figure 7B:
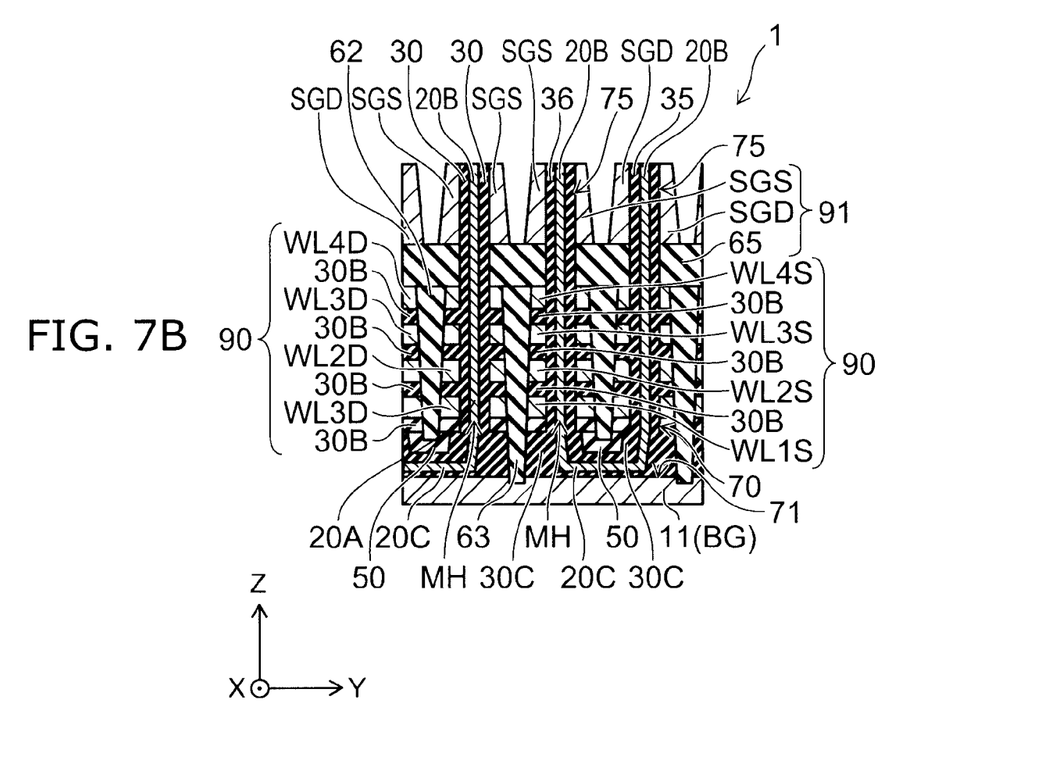

Insulating layers 62 and 63 shown in FIG. 7 are provided between the electrode layer WL1D and the electrode layer WL1S, between the electrode layer WL2D and the electrode layer WL2S, between the electrode layer WL3D and the electrode layer WL3S, between the electrode layer WL4D and the electrode layer WL4S, between the adjacent electrode layers WL1S, between the adjacent electrode layers WL2S, between the adjacent electrode layers WL3S and between the adjacent electrode layers WL4S.

The electrode layers WL1D, WL2D, WL3D and WL4D are provided between the back gate BG and a drain side selection gate SGD. The electrode layers WL1S, WL2S, WL3S and WL4S are provided between the back gate BG and a source side selection gate SGS.

The number of the electrode layers WL1D, WL2D, WL3D, WL4D, WL1S, WL2S, WL3S, and WL4S are optional, and is not limited to four as shown in FIG. 1. In the following description, there is a case in which each of the electrode layers WL1D, WL2D, WL3D, WL4D, WL1S, WL2S, WL3S, and WL4S is expressed merely as the electrode layer WL.

The electrode layer WL is, for example, a silicon layer having a conductivity, to which an impurity is added. An insulating film 30B has, for example, an ONO structure, which will be described later.

The drain side selection gate SGD is provided on the electrode layers WL4D via an insulating layer not shown. The drain-side selection gate SGD is, for example, a silicon layer to which an impurity element is added and which has electrical conductivity.

The source side selection gate SGS is provided on the electrode layers WL4S via an insulating layer not shown. The source side selection gate SGS is, for example, a silicon layer to which an impurity element is added and which has electrical conductivity.

The drain side selection gate SGD is separated from the source side selection gate SGS in the Y-direction. In the following description, there is a case in which each of the drain side selection gate SGD and the source side selection gate SGS is expressed merely as a selection gate SG without distinguishing them from each other.

A source line SL is provided on the source side selection gate SGS via an insulating layer not shown. The source line SL is a metal layer or a silicon layer to which an impurity element is added and which has electrical conductivity.

A plurality of bit lines BL are provided on the drain side selection gate SGD and the source line SL via an insulating layer not shown. Each of the bit lines BL extends in the Y-direction.

The plurality of U-shaped memory holes MH are formed in the back gate BG and the stacked body on the back gate BG. For example, the hole which penetrates the electrode layers WL1D to WL4D and the drain side selection gate SGD and extends in the Z-direction is formed. The hole which penetrates the electrode layers WL1S to WL4S and the source side selection gate SGS and extend in the Z-direction is formed. The pair of holes extending in the Z-direction are connected to each other through a concave portion (space portion) formed in the back gate BG to constitute the U-shaped memory hole MH.

A U-shaped channel body layer 20 is provided within the memory hole MH. The channel body layer 20 is, for example, a silicon layer. A memory film 30 is provided between the channel body layer 20 and an inner wall of the memory hole MH.

A gate insulating film 35 is provided between the channel body layer 20 and the drain side selection gate SGD. A gate insulating film 36 is provided between the channel body layer 20 and the source side selection gate SGS.

The structure is not limited to the one in which the whole of the memory hole MH is filled with the channel body layer 20, and may be the one in which the channel body layer 20 is formed so as to leave a cavity on the side of the central axis of the memory hole MH and an insulant is filled in the inner cavity.

The memory film 30A has, for example, ONO (Oxide-Nitride-Oxide) structure in which a silicon nitride film is sandwiched between a pair of silicon oxide films. As shown in FIG. 2, an insulating film 31, a charge storage film 32 and an insulating film 33 are provided between each of the electrode layers WL and the channel body layer 20 in this order from the side of the electrode layers WL. The insulating film 31 contacts the electrode layers WL, the insulating film 33 contacts the channel body layer 20, and the charge storage film 32 is provided between the insulating film 31 and the insulating film 33. An insulating film 30B is a layer which is formed with two layers having the ONO structure. For example, the insulating film 30B has a structure where two layers each of which is obtained by sandwiching the charge storage film 32 between the insulating films 31 and 32 are present.

The channel body layer 20 functions as a channel of a transistor constituting the memory cell, the electrode layers WL function as control gates and the charge storage film 32 functions as a data storage layer that stores a charge injected from the channel body layer 20. That is, at a crossing part of the channel body layer 20 and each of the electrode layers WL, a memory cell MC having the structure in which the control gate surrounds the circumference of the channel is formed.

A nonvolatile semiconductor memory device 1 of an embodiment is a nonvolatile semiconductor memory device capable of performing erasing and writing of data electrically freely, and of holding a memory content even if the power is turned off.

The memory cell MC is, for example, a charge trap-type memory cell. The charge storage film 32 has a lot of trap sites for trapping electrical charge (electron) and is, for example, a silicon nitride film. The second insulating film 33 is, for example, a silicon oxide film and serves as a potential barrier when the charge is injected from the channel body layer 20 to the charge storage film 32 or the charge stored in the charge storage film 32 is diffused into the channel body layer 20. The insulating film 31 is, for example, a silicon oxide film and prevents the charge stored in the charge storage film 32 from diffusing into the electrode layers WL.

The drain side selection gate SGD, the channel body layer 20 and the gate insulating film GD between the drain side selection gate SGD and the channel body layer 20 constitute a drain side selection transistor STD. The channel body layer 20 on the drain side selection transistor STD is connected to the bit lines BL.

The source side selection gate SGS, the channel body layer 20 and the gate insulating film 36 between the source side selection gate SGS and the channel body layer 20 constitute a source side selection transistor STS. The channel body layer 20 on the source side selection transistor STS is connected to the source line SL.

The back gate BG, the channel body layer 20 provided in the back gate BG and the memory film 30 constitutes a back gate transistor BGT.

The plurality of memory cells MC using the respective electrode layers WL4D to WL1D as the control gates are provided between the drain side selection transistor STD and the back gate transistor BGT. Similarly, the plurality of memory cells MC using the respective electrode layers WL1S to WL4S as the control gates are provided between the back gate transistor BGT and the source side selection transistor STS.

These plurality of memory cells MC, the drain side selection transistor STD, the back gate transistor BGT and the source side selection transistor STS are connected in series through the channel body layer 20 to constitute one U-shaped memory string MS.

One memory string MS has a pair of columnar parts CL extending in a stacking direction of the stacked body 53A including a plurality of electrode layers WL, and a coupling part JP which is embedded in the back-gate BG and couples the pair of the columnar parts CL. By the plurality of memory-strings MS being aligned in the X-direction and the Y-direction, a plurality of memory cells MC are provided in the X-direction, the Y-direction and the Z-direction three-dimensionally.

The plurality of memory strings MS are provided in a memory cell array region in the substrate 10. In the periphery, for example, of the memory cell array region in the substrate 10, a peripheral circuit which controls the memory cell array is provided.

Next, a specific manufacturing process of the nonvolatile semiconductor memory device 1 and a further specific form of the nonvolatile semiconductor memory device 1 will be described.

FIGS. 3A and 3B and 4A to 4C are schematic views for describing the manufacturing process of the nonvolatile semiconductor memory device according to the first embodiment. The diagram on the right in each of the figures is a schematic view of the upper face; the diagram on the left in each of the figures is a cross-sectional view taken along position X-Y in the schematic view of the upper face.

Figure 3A:
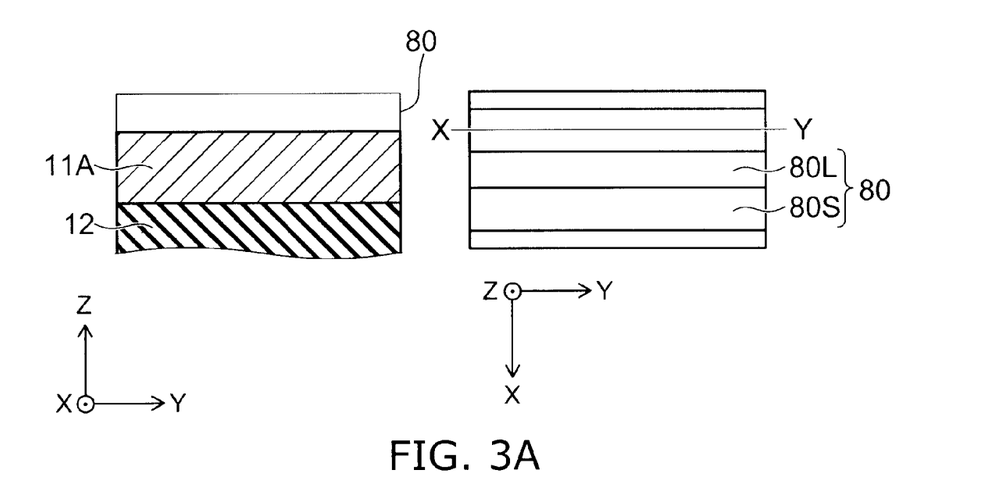
FIGS. 3A and 3B and 4A to 4C are schematic views for describing a manufacturing process of the nonvolatile semiconductor memory device according to the first embodiment.

First, as shown in FIG. 3A, the semiconductor layer 11A containing the impurity element is formed on a foundation layer 12. The semiconductor layer 11A is, for example, a silicon layer to which boron is added. The boron-added silicon layer serves as the back gate BG, which will described later. The foundation layer 12 has, for example, a transistor and wiring of a peripheral circuit part controlling the memory cell, an interlayer insulating film and the like.

Then, on the semiconductor layer 11A, a resist pattern 80 of a line-and-space type is formed by a photolithography process. The resist pattern 80 has a line portion 80L and a space portion 80S. The line portion 80L and the space portion 80S are alternately aligned in the X-direction. The line portion 80L and the space portion 80S extend in the Y-direction in a stripe shape. Then, the semiconductor layer 11A exposed from the space portion 80S is subjected to dry etching. After that, the resist pattern 80 is removed.

Figure 3B:
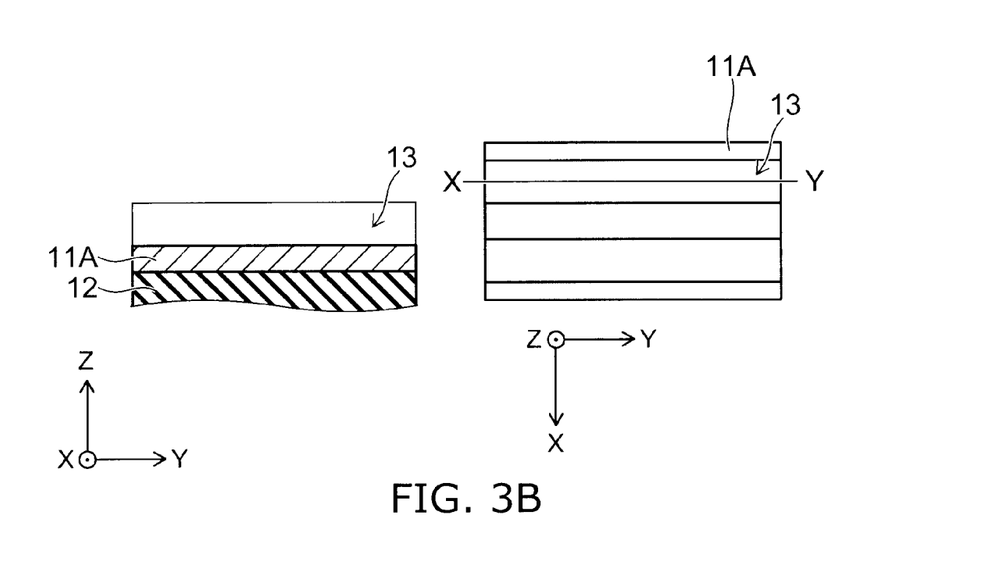

By the dry etching, as shown in FIG. 3B, a groove 13 corresponding to the position of the coupling part JP coupling the lower ends of the memory holes MH is formed in the semiconductor layer 11A. The groove 13 extends in the Y-direction.

Figure 4A:
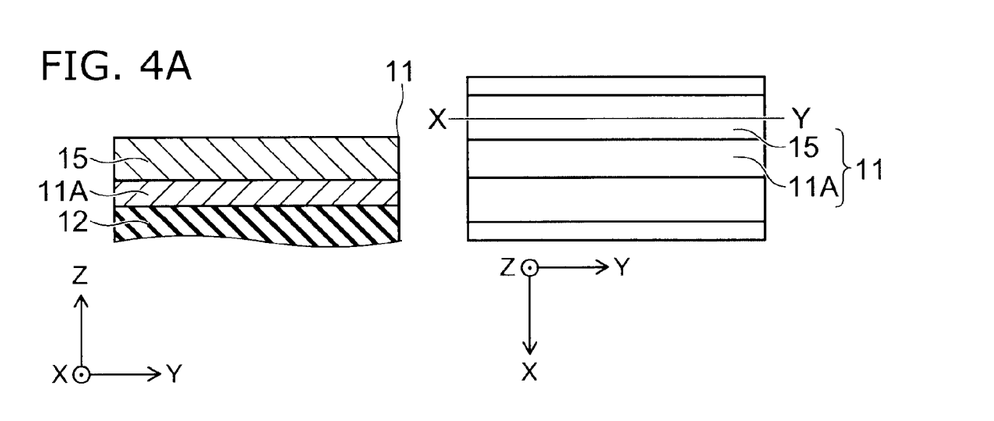

Then, an additive-free silicon sacrifice film 15 is formed on the groove 13. This state is shown in FIG. 4A. The additive-free silicon sacrifice film 15 is, for example, a non-doped silicon film. The excessive part of the additive-free silicon sacrifice film 15 is removed by etch back, and thus the surface of the semiconductor layer 11A between the adjacent additive-free silicon sacrifice films 15 is exposed.

As viewed in a direction perpendicular to the major surface of the semiconductor layer 11A, a semiconductor layer 11 is formed, which has: an impurity-containing region in a stripe shape which contains an impurity element; and a to-be-etched region in a stripe shape which has a concentration of the impurity lower than the concentration of the impurity-containing region. The impurity-containing region is the semiconductor layer 11 which is sandwiched between the adjacent the additive-free silicon sacrifice films 15; the to-be-etched region is the additive-free silicon sacrifice film 15. As viewed in the direction perpendicular to the major surface of the semiconductor layer 11, in the semiconductor layer 11, a pattern is formed in which the impurity-containing region and the to-be-etched region are alternately aligned in the X-direction (the first direction).

Figure 4B:
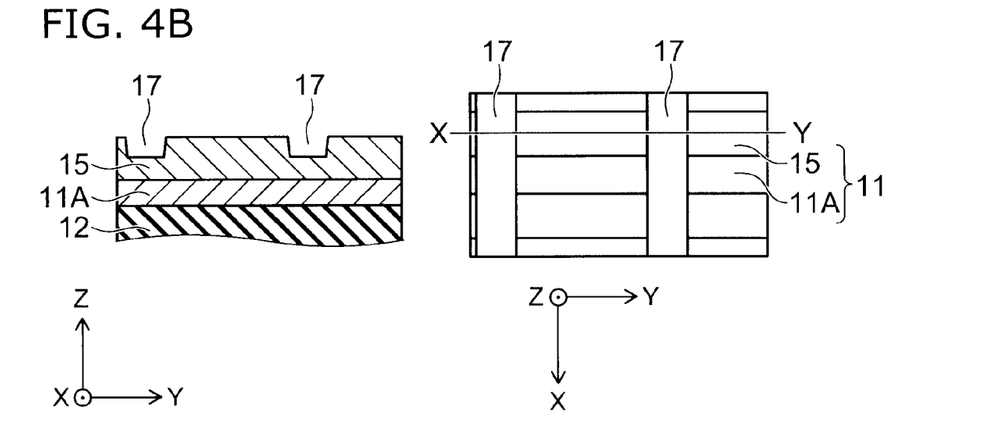

Then, as shown in FIG. 4B, in a direction toward the inside from the surface of each of the semiconductor layer 11 and the additive-free silicon sacrifice film 15, a plurality of grooves 17 extending in the X-direction are formed by a photolithography process. The grooves 17 are arranged approximately in the center of a portion in which the coupling part JP is formed.

Figure 4C:
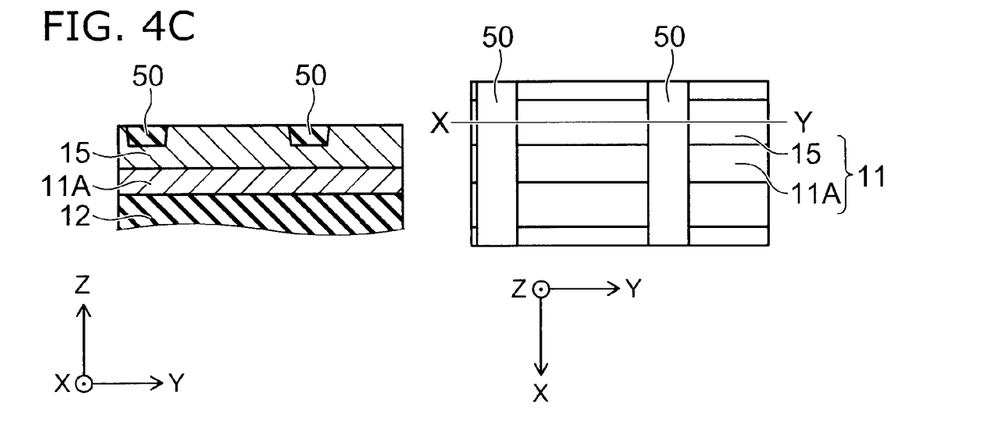

Then, as shown in FIG. 4C, an insulating layer 50 (the first insulating layer) functioning as a stopper layer is formed on the groove 17. The material of the insulating layer 50 is, for example, silicon oxide ($SiO_2$). The excessive part of the insulating layer 50 is removed by etch back, and the surface of the semiconductor layer 11, the surface of the additive-free silicon sacrifice film 15 and the surface of the insulating layer 50 are made to lie approximately in the same plane. At this stage, in a direction from the surface of each of the impurity-containing region and the to-be-etched region, toward the inside, a plurality of insulating layers 50 in a stripe shape extending are formed in the X-direction.

FIGS. 5A to 5C, 6A to 6C and 7A and 7B are cross-sectional schematic views illustrating the manufacturing process of the nonvolatile semiconductor memory device according to the first embodiment. FIGS. 5A to 5C, 6A to 6C and 7A and 7B show cross sections corresponding to the position X-Y of FIG. 3 (or FIG. 4). In FIGS. 5A to 5C, 6A to 6C and 7A and 7B, the foundation layer 12 is omitted.

Figure 5A:
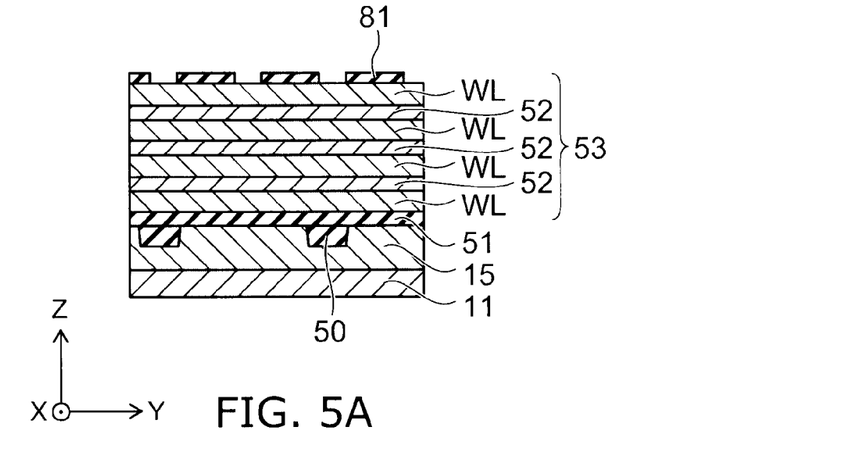
FIGS. 5A to 5C, 6A to 6C and 7A and 7B are cross-sectional schematic views illustrating the manufacturing process of the nonvolatile semiconductor memory device according to the first embodiment.

Then, as shown in FIG. 5A, on the semiconductor layer 11 and the insulating layer 50, a stacked body 53 including a plurality of electrode layers WL are formed via an insulating film 51 (the first insulating film). The insulating film 51 is a silicon oxide film. The stacked body 53 includes a to-be-etched layer 52 between each of the plurality of electrode layers WL. The stacked body 53 is a stacked body in which the electrode layers WL and the to-be-etched layers 52 are stacked in layers. The electrode layer WL is, for example, a boron-added silicon layer. The electrode layer WL has sufficient conductivity as a gate electrode. The to-be-etched layer 52 is an additive-free silicon layer. Then, on the stacked body 53, a mask pattern 81 made up of a silicon oxide film is formed.

Figure 5B:
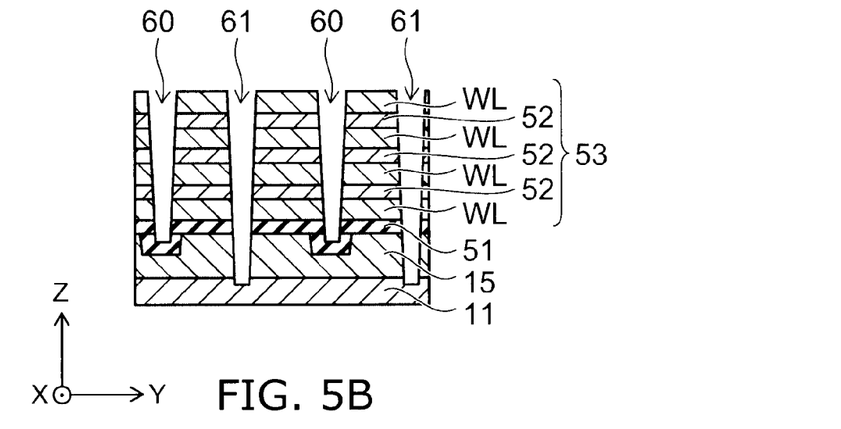

Then, as shown in FIG. 5B, the stacked body 53 exposed from the surface of the mask pattern 81 is removed by dry etching, and thus a slit 61 (the second slit) together with a slit 60 (the first slit) is formed. The phrase "together with" described here means not only forming the slit 60 and the slit 61 simultaneously but also forming the slit 60 and the slit 61 not simultaneously, but individually. The slit 60 extends in the X-direction. The slit 60 reaches each of a plurality of insulating layers 50 from the surface of the stacked body 53. The slits 61 are arranged approximately parallel to the slits 60. The slit 61 penetrates the stacked body 53, the insulating film 51 and the additive-free silicon sacrifice film 15 (the to-be-etched region). The stacked body 53 is separated by the slit 60 and the slit 61 in the Y-direction. Furthermore, the additive-free silicon sacrifice film 15 is separated by the slit 61 in the Y-direction.

The thickness of the insulating layer 50 before the slit 60 reaches the insulating layer 50 is greater than the thickness of the insulating film 51. When the slit 60 and the slit 61 are formed simultaneously, the insulating layer 50 effectively functions as an etching stop layer. When the slit 60 and the slit 61 are formed simultaneously by etching, the additive-free silicon sacrifice film 15 is separated by the slit 61, and thus the film 15 is delimited for a predetermined region, but the delimited additive-free silicon sacrifice film 15 is not separated by the slit 60. This is because, when the slit 60 and the slit 61 are formed simultaneously by the progress of etching, the lower end of the slit 61 reaches the semiconductor layer 11 but the lower end of the slit 60 is kept within the insulating layer 50 by the insulating layer 50.

Figure 5C:
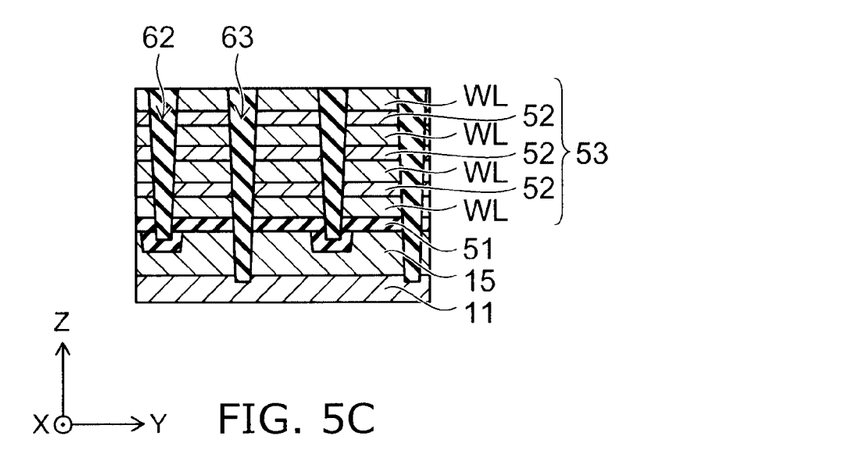

Next, as shown in FIG. 5C, the insulating layer 62 (the second insulating layer) is formed within the slit 60, and the insulating layer 63 (the third insulating layer) is formed within the slit 61. The material of the insulating layers 62 and 63 is, for example, silicon nitride ($Si_3N_4$). After that, the excessive part of the insulating layers 62 and 63 is removed by etch back, and thus the electrode layer WL of the uppermost layer is exposed.

Figure 6A:
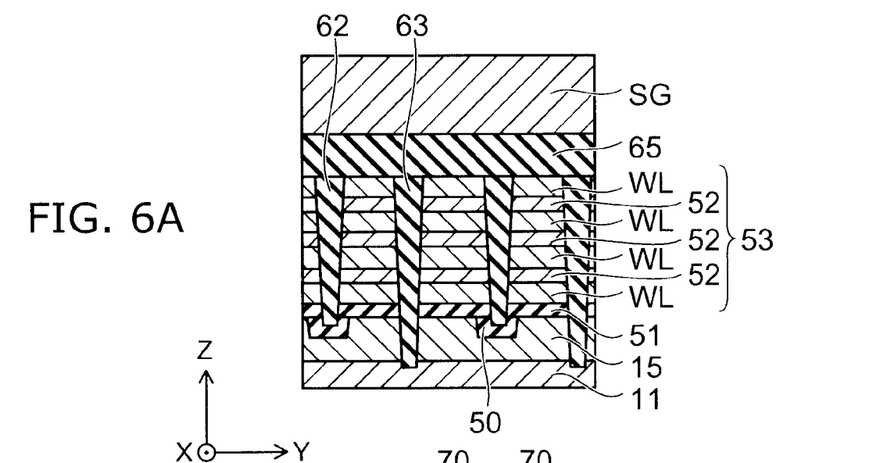

Then, as shown in FIG. 6A, an interlayer insulating film 65 formed of silicon oxide is formed on each of the stacked body 53, the insulating layer 62 and the insulating layer 63. Then, the selection gate SG is formed on the interlayer insulating film 65. The material of the selection gate SG is silicon to which boron is added. Furthermore, on the selection gate SG, an oxide film for protecting the selection gate SG is formed (not shown).

Figure 6B:
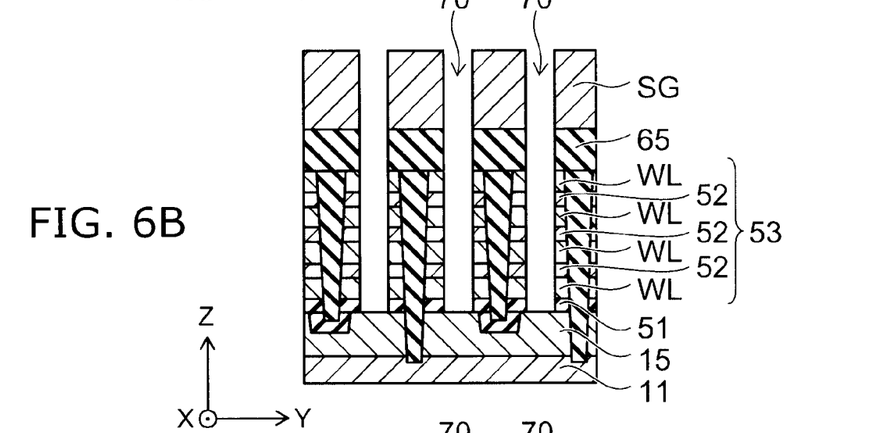

After that, as shown in FIG. 6B, the stacked body 53 reaches the additive-free silicon sacrifice film 15 (the to-be-etched region) by photolithograph and dry etching, and furthermore a pair of holes 70 sandwiching the insulating layer 62 are formed. Within the pair of holes 70, the to-be-etched layer 52 which is provided between each of the plurality of electrode layers WL is exposed.

Figure 6C:
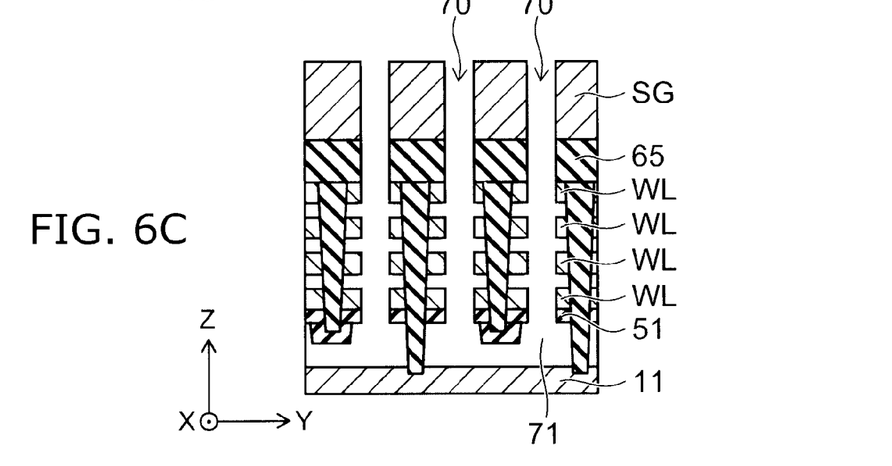

Then, as shown in FIG. 6C, the to-be-etched layer 52 which is provided between the additive-free silicon sacrifice film 15 (the to-be-etched region) and each of the plurality of electrode layers WL is removed by the pair of holes 70. For example, by introducing alkali-based chemical solution processing into the holes 70, the additive-free silicon sacrifice film 15 and the to-be-etched layer 52 are removed by the pair of holes 70. As the alkali-based chemical solution, a KOH (potassium hydroxide) solution is used. In the semiconductor layer 11, a space portion (concave portion) 71 which is connected to the lower end of each of the pair of holes 70 is formed. In addition, the surface of each of the plurality of electrode layers WL is exposed.

Then, as shown in FIG. 7A, the memory film 30 including the charge storage film 32 is formed on the side wall of each of the pair of holes 70. Furthermore, on the upper and lower faces of each of the plurality of electrode layers WL, the insulting film 30B (the second insulating film) is formed. Moreover, on the inner wall of the space portion 71, an insulating film 30C (the fourth insulating film) including the charge storage film 32 is formed. The memory film 30, the insulating film 30B and the insulating film 30C are formed by, for example, an atomic layer deposition method (ALD method). The form of the memory film 30 is shown in FIG. 2.

Subsequently, the channel body layer 20 is formed on the surface of the memory film 30 and the surface of the insulating film 30C. The channel body layer 20 is, for example, an additive-free silicon film. The first embodiment includes not only an embodiment in which the channel body layer 20 is completely formed within the hole 70 and the space portion 71 but also an embodiment in which the channel body layer 20 is shaped in the form of a cylinder. In addition, as necessary, the excessive part of the memory film 30 and the excessive part of the channel body layer 20 are removed by etch back.

Next, as shown in FIG. 7B, the selection gate SG is separated by photolithography and dry etching, and the drain side selection gate SGD and the source side selection gate SGS are formed. After that, the other members (a contact electrode, wiring, and the like) are formed, and thus the nonvolatile semiconductor memory device 1 is formed.

As shown in FIG. 7B, the nonvolatile semiconductor memory device 1 includes the semiconductor layer 11 including an impurity element. The semiconductor layer 11 corresponds to the back gate BG illustrated in FIG. 1.

The nonvolatile semiconductor memory device 1 is provided on the surface of the semiconductor layer 11, and includes the insulating film 30C (the fourth insulating layer) on the surface of which the insulating layer 50 (the first insulating layer) is provided.

The nonvolatile semiconductor memory device 1 includes a stacked body 90 (the first stacked member) that has a plurality of electrode layers WL and a plurality of insulating films 30B (the second insulating films) stacked alternately on the insulating film 30C. The plurality of electrode layers WL are composed of the electrode layer WL1D, the electrode layer WL2D, the electrode layer WL3D, the electrode layer WL4D, the electrode layer WL1S, the electrode layer WL2S, the electrode layer WL3S and the electrode layer WL4S.

The nonvolatile semiconductor memory device 1 includes the charge storage film 32 which is provided on the side wall of each of the pair of holes 70 formed penetrating the stacked body 90 in the stacking direction of the stacked body 90. The pair of holes 70 reach the insulting film 30C.

The nonvolatile semiconductor memory device 1 includes a channel body layer 20A (the first channel body layer) which is provided inside the charge storage film 32 within each of the pair of holes 70.

The nonvolatile semiconductor memory device 1 includes a stacked body (the second stacked body) 91 which is provided on the stacked body 90. The stacked body 91 includes the interlayer insulating film 65 and the selection gate SG provided on the interlayer insulating film 65. The selection gate SG refers to the drain side selection gate SGD and the source side selection gate SGS.

The nonvolatile semiconductor memory device 1 includes a gate insulating film provided on the side wall of a hole 75 (the second hole) which communicates with the upper end of each of the pair of holes 70 and which is formed penetrating the stacked body 91 in the stacking direction of the stacked body 91. The gate insulating film refers to the gate insulating film 35 of the drain side selection gate SGD and the gate insulating film 36 of the source side selection gate SGS.

The nonvolatile semiconductor memory device 1 includes a channel body layer 20B (the second channel body) which is provided inside the gate insulating film within the hole 75 and which is connected to the channel body layer 20A.

The nonvolatile semiconductor memory device 1 includes a channel body layer 20C (the third channel body) which is connected to the lower end of each of the channel body layers 20A provided within the pair of holes 70. The channel body layer 20C is provided within the insulating film 30C. The insulating film 30C functions as the back gate insulating film of the back gate BG.

The nonvolatile semiconductor memory device 1 includes the insulating layer 62 (the second insulating layer) which is sandwiched between the pair of holes 70, which penetrates the stacked body 90 from the surface of the stacked body 90 and which reaches the insulating layer 50.

The nonvolatile semiconductor memory device 1 includes the insulating layer 63 (the third insulating layer) which is provided between the pair of holes 70 and a pair of holes 70 other than the pair of holes 70, which penetrates the insulating film 30C from the surface of the stacked body 90, and which reaches the semiconductor layer 11. The insulating layer 63 is provided in a portion of the stacked body 53 other than the portion of the stacked body 53 sandwiched between the pair of holes 70.

The insulating layer 50 is provided in the center portion of the insulating film 30C. The channel body layers 20A, 20B and 20C communicate with each other, and form the channel body layer 20 integrally.

The manufacturing process of a nonvolatile semiconductor memory device according to a reference example will now be described. In the manufacturing process of the nonvolatile semiconductor memory device according to the reference example, the resist pattern 80 of lines and spaces described above is not used.

Figure 8A:
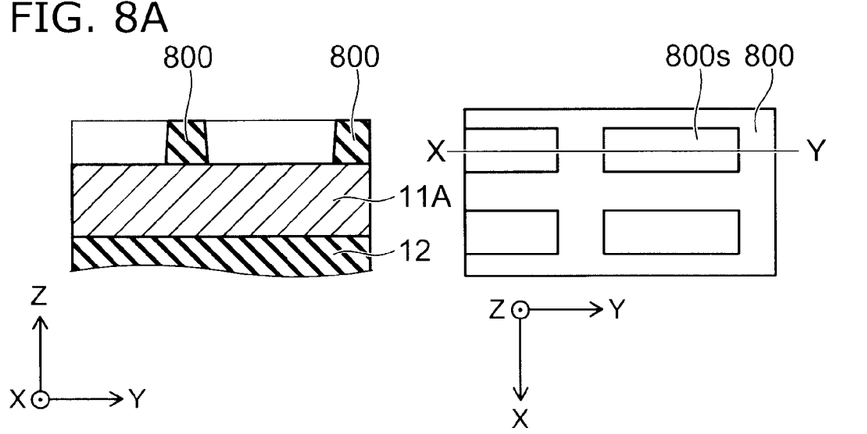
FIGS. 8A to 8C are schematic views for describing a manufacturing process of a nonvolatile semiconductor memory device according to a reference example
Figure 8B:
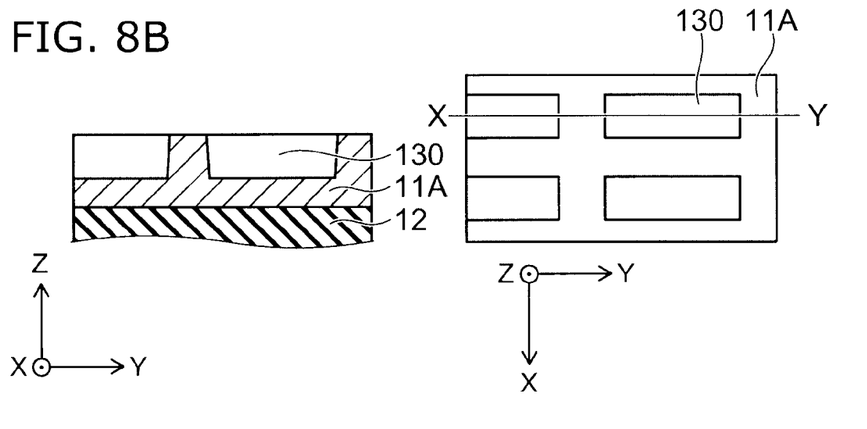
Figure 8C:
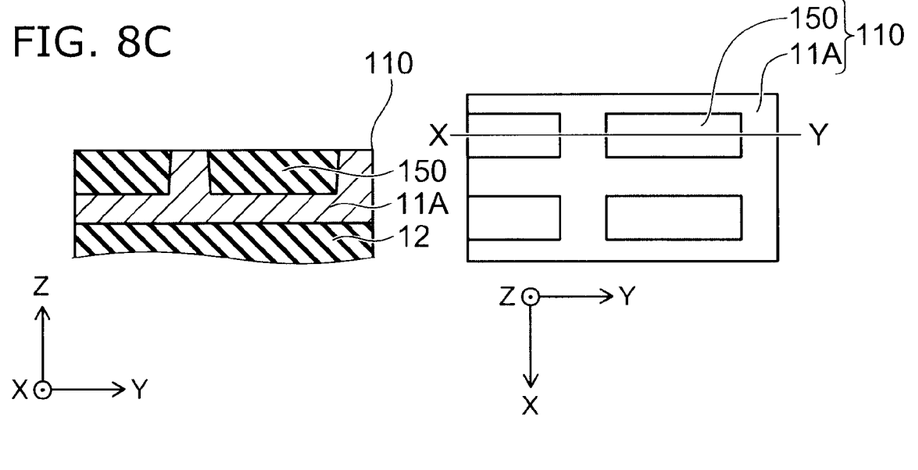

FIGS. 8A to 8C are schematic views for describing the manufacturing process of the nonvolatile semiconductor memory device according to the reference example. The diagram on the right in each of the figures is a schematic view of the upper face; the diagram on the left in each of the figures is a cross-sectional view taken along position X-Y in the schematic view of the upper face.

As shown in FIG. 8A, the semiconductor layer 11A is formed on the foundation layer 12. After that, a resist pattern 800 is formed on the semiconductor layer 11A by a photolithography process. Instead of the line-and-space type, rectangular spaces 800S are periodically provided in the X-direction and the Y-direction.

Then, dry etching is performed on the semiconductor layer 11A exposed from the spaces 800S. After that, the resist pattern 800 is removed.

By this dry etching, as shown in FIG. 8B, a groove 130 is formed that corresponds to the position of the coupling part JP coupled to the lower end of the memory hole MH. The grooves 130 are periodically formed in the X-direction and the Y-direction.

Then, as shown in FIG. 8C, an additive-free silicon sacrifice film 150 is formed in the groove 130. As viewed in a direction perpendicular to the major surface of the semiconductor layer 11A, a semiconductor layer 110 is formed that includes: an impurity-containing region which contains an impurity element (the semiconductor layer 11A); and a to-be-etched region (the additive-free silicon sacrifice film 150) which has a concentration of the impurity lower than the concentration of the impurity-containing region. At this stage, the additive-free silicon sacrifice film 150 is divided by the semiconductor layer 11A in the X-direction and the Y-direction. That is, each additive-free silicon sacrifice film 150 has already become an isolation pattern.

FIGS. 9A to 9C and 10A to 10C are cross-sectional schematic views illustrating the manufacturing process of the nonvolatile semiconductor memory device according to the reference example. FIGS. 9A to 9C and 10A to 10C show cross sections corresponding to position X-Y of FIG. 3 (or FIG. 4). In FIGS. 9A to 9C and 10A to 10C, the foundation layer 12 is omitted.

Figure 9A:
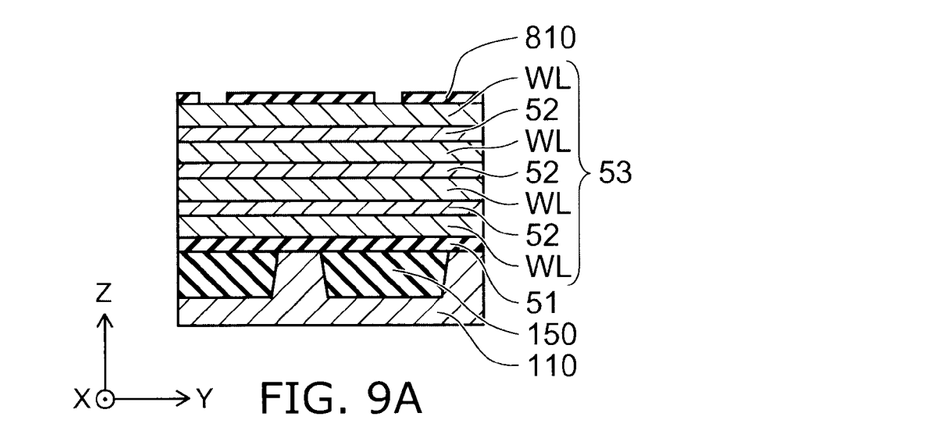
FIGS. 9A to 9C and 10A to 10C are cross-sectional schematic views illustrating the manufacturing process of the nonvolatile semiconductor memory device according to the reference example.

Then, as shown in FIG. 9A, the stacked body 53 including a plurality of electrode layers WL on a semiconductor layer 110 through the insulting film 51. The stacked body 53 includes the to-be-etched layer 52 between each of the plurality of electrode layers WL. After that, a mask pattern 810 made up of a silicon oxide film is formed on the stacked body 53.

Figure 9B:
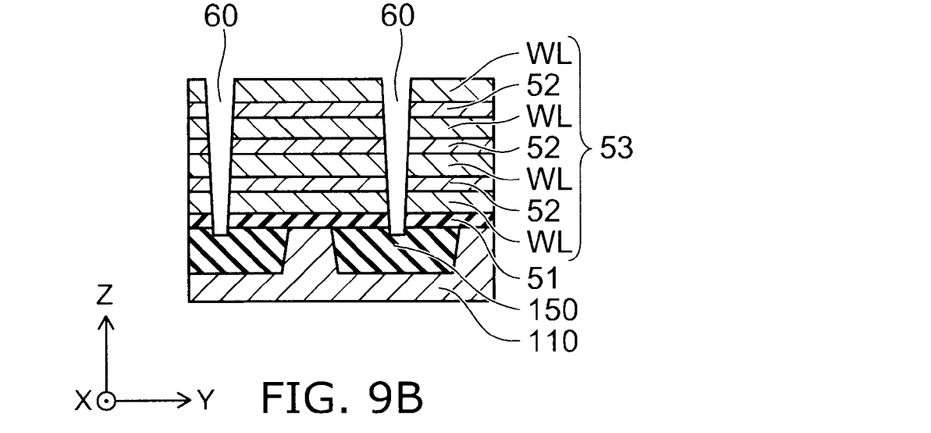

Then, as shown in FIG. 9B, by dry etching, the stacked body 53 exposed from the mask pattern 810 is removed, and thus the slit 60 is formed. The slit 60 extends in the X-direction. The slit 60 reaches each of a plurality of additive-free silicon sacrifice films 150 from the surface of the stacked body 53. The stacked body 53 is separated by the slit 60 in the Y-direction. The slit 60 is formed approximately in the center of the additive-free silicon sacrifice film 150.

Figure 9C:
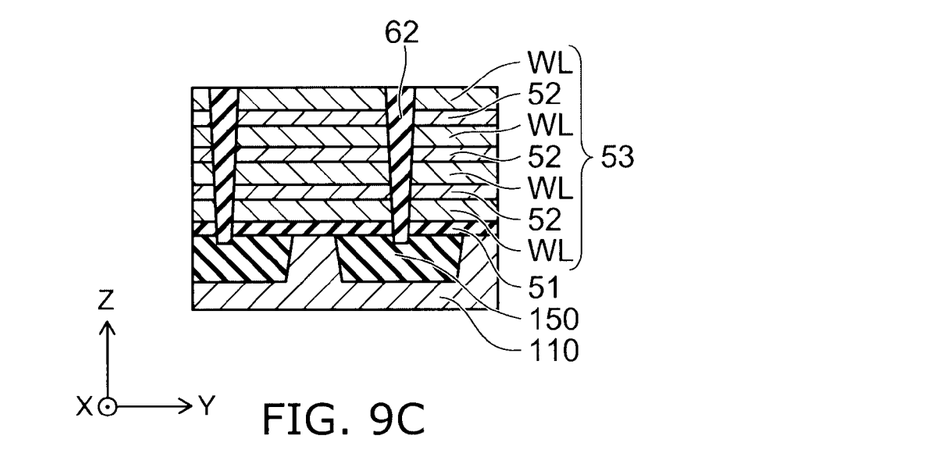

Then, as shown in FIG. 9C, the insulating layer 62 is formed within the slit 60. After that, the excessive part of the insulating layer 62 is removed by etch back, and the electrode layer WL of the uppermost layer is exposed. In the reference example, since the additive-free silicon sacrifice film 150 is already delimited on an individual predetermined region, the slit 61 (or the insulating layer 63) formed in the first embodiment is not formed.

Figure 10A:
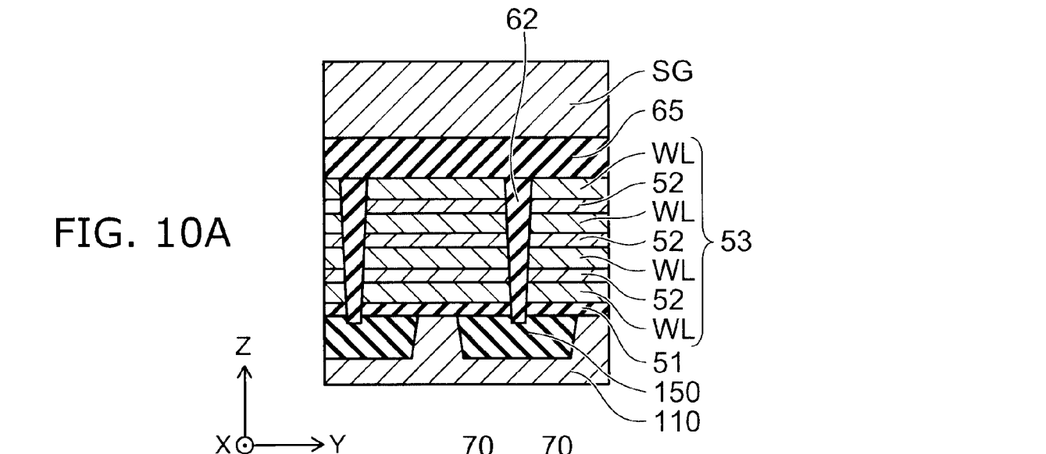

Then, as shown in FIG. 10A, the interlayer insulating film 65 is formed on the stacked body 53 and the insulating layer 62. After that, the selection gate SG is formed on the interlayer insulating film 65. Furthermore, on the selection gate SG, an oxide film for protecting the selection gate SG is formed (not shown).

Figure 10B:
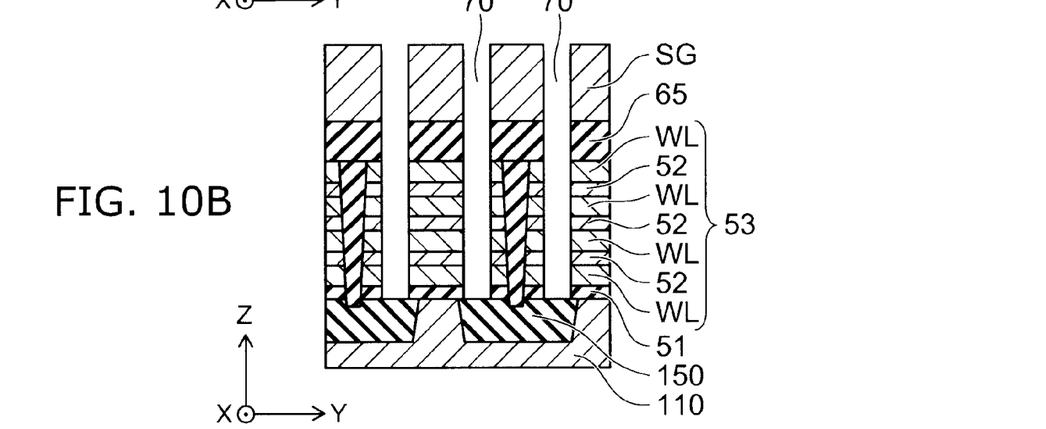

Then, as shown in FIG. 10B, the stacked body 53 reaches the additive-free silicon sacrifice film 150 by photolithograph and dry etching, and furthermore a pair of holes 70 sandwiching the insulating layer 62 are formed. Within the pair of holes 70, the to-be-etched layer 52 which is provided between each of the plurality of electrode layers WL is exposed.

Figure 10C:
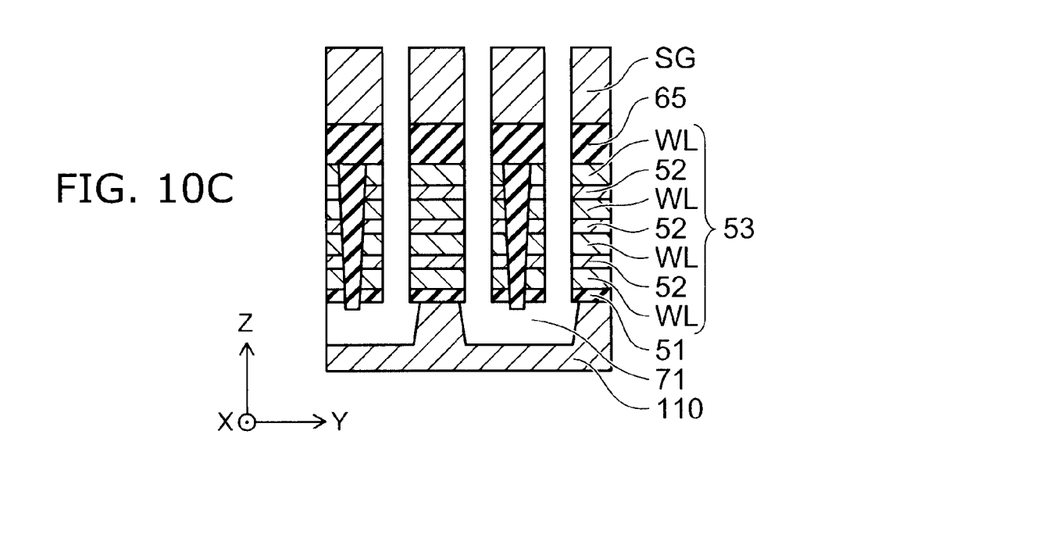

Then, as shown in FIG. 10C, the to-be-etched layer 52 which is provided between the additive-free silicon sacrifice film 15 and each of the plurality of electrode layers WL is removed by using an alkali-based chemical solution through the pair of holes 70. In the semiconductor layer 110, the space portion 71 which is connected to the lower end of each of the pair of holes 70 is formed. In addition, the surface of each of the plurality of electrode layers WL is exposed.

Then, as explained through the use of FIGS. 7A and 7B, the memory film 30 including the charge storage film 32 is formed on the side wall of each of the pair of holes 70. Furthermore, on the surfaces of each of the plurality of electrode layers WL, the insulating film 30B is formed. On the inner wall of the space portion 71, the insulating film 30C including the charge storage film 32 is formed. After that, the channel body layer 20 is formed on the surface of the memory film 30 and the surface of the insulting film 30C. Moreover, the drain side selection gate SGD and the source side selection gate SGS are formed. Then, the other members (a contact electrode, wiring, and the like) are formed, and thus the nonvolatile semiconductor memory device 1 according to the reference example is formed.

In the manufacturing process of the nonvolatile semiconductor memory device according to the reference example, the resist pattern 800 formed on the semiconductor layer 11A is not the line and space type. In the resist pattern 800, the rectangular spaces 800S are periodically provided in the X-direction and the Y-direction.

However, it is difficult to periodically and highly accurately form the rectangular spaces 800S in the X-direction and the Y-direction by a photolithography process. As the size of the nonvolatile semiconductor memory device becomes finer, it becomes increasingly difficult to provide the rectangular spaces 800S periodically. Therefore, by the method for manufacturing the nonvolatile semiconductor memory device according to the reference example, it is impossible to sufficiently acquire a process margin of the photolithography process.

Furthermore, when the slit 60 is formed approximately in the center of the additive-free silicon sacrifice film 150, the insulating film 51 having a thickness smaller than a thickness of the insulating layer 50 actually serves as a stopper layer. However, if the thickness of the insulating film 51 is small, the insulating film 51 does not function as the stopper layer, and the slit 60 may unintentionally protrude to the lower face of the additive-free silicon sacrifice film 150. That is, by the method for manufacturing the nonvolatile semiconductor memory device according to the reference example, it is also impossible to sufficiently acquire a process margin of the etching process.

In contrast to this, in the process of manufacturing the nonvolatile semiconductor memory device according to the first embodiment, the resist pattern 80 formed on the semiconductor layer 11A is the line and space type. In the resist pattern 80, the line portion 80L and the space portion 80S are alternately aligned in one direction. It is possible to accurately form this type of resist pattern as compared with the resist pattern 800. Therefore, by the method for manufacturing the nonvolatile semiconductor memory device according to the first embodiment, it is possible to sufficiently acquire a process margin of the photolithography process.

In the process of manufacturing the nonvolatile semiconductor memory device according to the first embodiment, since the resist pattern 80 of the line and space type is used, it is impossible to delimit the additive-free silicon sacrifice film 15 on an individual region basis before the formation of the stacked body 53. However, since, after the formation of the stacked body 53, the additive-free silicon sacrifice film 15 is delimited by the slit 61 on an individual region basis, an isolation pattern of the additive-free silicon sacrifice film 15 is formed without any inconvenience.

In the process of manufacturing the nonvolatile semiconductor memory device according to the first embodiment, when the slit 60 and the slit 61 are formed, the insulating layer 50 functions as the stopper of the slit 60. Therefore, during the process, the slit 60 is prevented from intentionally reaching the additive-free silicon sacrifice film 15. That is, by the process of manufacturing the nonvolatile semiconductor memory device according to the first embodiment, it is also possible to sufficiently acquire a process margin of the etching process.

In the process of manufacturing the nonvolatile semiconductor memory device according to the first embodiment, after the formation of the pair of hoes 70 and the space portion 71 (see FIG. 6C), the insulating layer 63 formed within the slit 61 functions as a column. Therefore, even if the stacked body 53 becomes a pillar having a high aspect ratio by the slit 60 and the slit 61, it is possible to acquire the mechanical strength of each pillar by the insulating layer 63 during the process.

Second Embodiment

Although, in the first embodiment, the process is performed by a so-called replace technology for removing, through the pair of holes 70, the to-be-etched layer 52 provided between the additive-free silicon sacrifice film 15 and each of the plurality of electrode layers WL, in the second embodiment, the process is performed without depending on the replace technology.

Figure 11A:
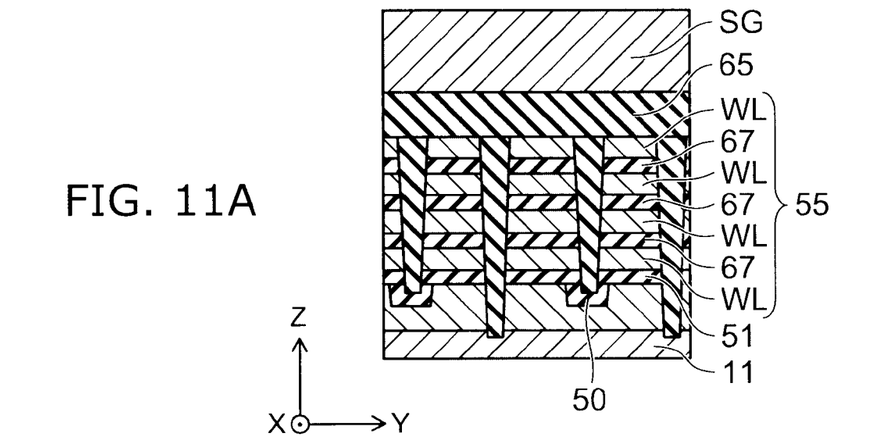
FIGS. 11A to 11C are cross-sectional schematic views illustrating a manufacturing process of a nonvolatile semiconductor memory device according to a second embodiment.
Figure 11B:
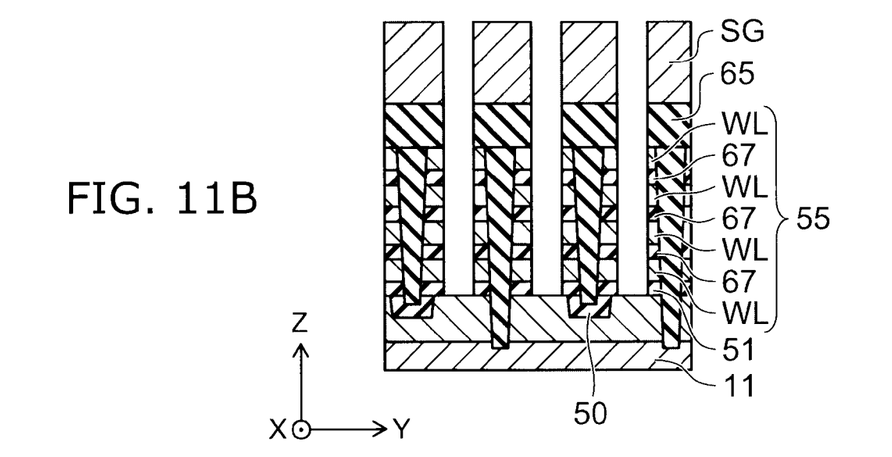
Figure 11C:
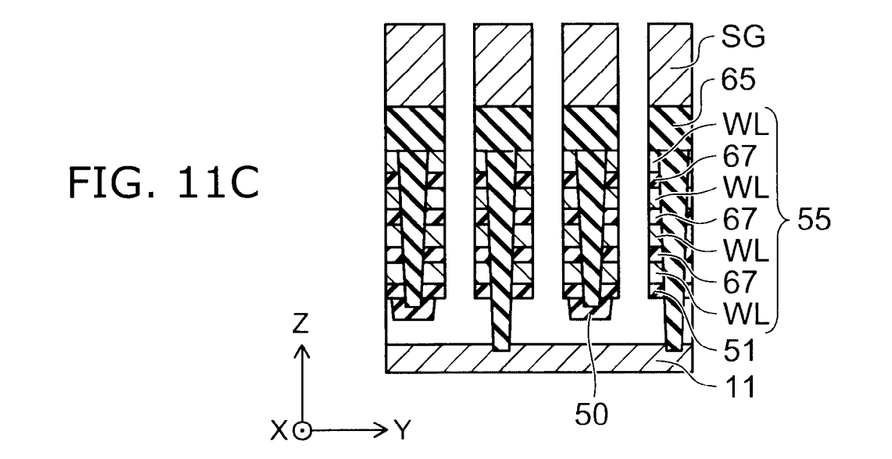

FIGS. 11A to 11C are cross-sectional schematic views illustrating the manufacturing process of the nonvolatile semiconductor memory device according to the second embodiment. FIGS. 11A to 11C show cross sections corresponding to position X-Y of FIG. 3 (or FIG. 4). In FIGS. 11A to 11C, the foundation layer 12 is omitted.

In the second embodiment, instead of the stacked body 53, a stacked body 55 is formed on the insulating film 51. The stacked body 55 includes, instead of the to-be-etched layer 52, an insulating layer 67 between each of the plurality of electrode layers WL. The insulating layer 67 is, for example, a TEOS (tetraethoxysilane) layer containing a silicon oxide. The stacked body 55 is a stacked body which is obtained by stacking the electrode layers WL and the insulating layers 67 in layers.

After forming the slits 60 and 61 through the use of this type of stacked body 55, as shown in FIG. 11A, the insulating layer 62 is formed within the slit 60, and the insulating layer 63 is formed within the slit 61. The interlayer insulating film 65 is formed on the stacked body 55, and the selection gate SG is formed on the interlayer insulating film 65. Furthermore, on the selection gate SG, an oxide film for protecting the selection gate SG is formed (not shown).

Then, as shown in FIG. 11B, the stacked body 55 reaches the additive-free silicon sacrifice film 15 by photolithograph and dry etching, and furthermore the pair of holes 70 sandwiching the insulating layer 62 are formed. Within the pair of holes 70, the insulating layer 67 which is provided between each of the plurality of electrode layers WL is exposed.

Then, as shown in FIG. 11C, removal is performed by the additive-free silicon sacrifice film 15 (the to-be-etched region). For example, by introducing alkali-based chemical solution processing into the holes 70, the additive-free silicon sacrifice film 15 is removed by the pair of holes 70. In the semiconductor layer 11, a space portion (concave portion) 71 which is connected to the lower end of each of the pair of holes 70 is formed.

Then, as shown in FIGS. 7A and 7B, the memory film 30 including the charge storage film 32 is formed on the sidewall of each of the pair of holes 70. On the inner wall of the space portion 71, the insulating film 30C including the charge storage film 32 is formed. After that, the channel body layer 20 is formed on the surface of the memory film 30 and the surface of the insulating film 30C. Then, the selection gate SG is separated, and the drain side selection gate SGD and the source side selection gate SGS are formed. After that, the other members (for example, a contact electrode and wiring) are formed. By this type of manufacturing process, the nonvolatile semiconductor memory device 1 is also formed. In the second embodiment, it is also possible to obtain the same effects as in the first embodiment.

Hereinabove, exemplary embodiments are described with reference to specific examples. However, the embodiments are not limited to these specific examples. That is, also ones in which a person skilled in the art has added a design modification to the specific examples appropriately, are included within the scope of the embodiments to the extent that they are provided with characteristics of the embodiments. Each component and arrangement thereof, material, conditions, shape, size, etc., which each of the specific examples described above includes are not limited to ones illustrated, and are able to be modified appropriately.

Further, each of components which each of the embodiments mentioned above includes is able to be compounded to the extent that they are technically possible, and ones which combine these also are included within the scope of the embodiments to the extent that they include the characteristics of the embodiments. Moreover, it should be understood that in the concept category of the embodiments, a person skilled in the art could have been able to conceive various kinds of the change examples and modification examples, and these change examples and modification examples also are included within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
   a semiconductor layer containing an impurity element;
   a stacked body provided above the semiconductor layer and including a plurality of electrode layers stacked in a first direction perpendicular to the semiconductor layer;
   a channel body layer including a pair of vertical portions each extending in the first direction through the stacked body and a horizontal portion provided between the stacked body and the semiconductor layer, each of the vertical portions being provided through the electrode layers stacked in the first direction and connected via the horizontal portion to each other;
   a multi-layer insulating film provided around the channel body layer, the multi-layer insulating layer including a first portion provided between the vertical portion and each electrode layer, and a second portion provided around the horizontal portion;
   a first insulating wall provided between the pair of vertical portions of the channel body layer, and extending in the first direction through the stacked body; and
   a second insulating wall provided outside the vertical portions of the channel body layer and extending in the first direction from the semiconductor layer through the stacked body, and
   the second portion of the multi-layer insulating film extending in a second direction parallel to the semiconductor layer so as to contact the second insulating wall under the stacked body.

2. The device according to claim 1, wherein
   the multi-layer insulating film includes a first insulating film, a second insulating film and a charge storage film provided between the first insulating film and the second insulating film, and the charge storage film stores a charge injected from the channel body layer via the second insulating film,
   wherein part of the first insulating film is in contact with the second insulating wall, and part of the second insulating film is in contact with the horizontal portion of the channel body layer.

3. The device according to claim 1, wherein the first portion of the multi-layer insulating film extends between electrode layers adjacent to each other in the first direction, and includes a plurality of charge storage film sections between respective of the electrode layers and the channel body layer, provided along the vertical portion of the channel body layer.

4. The device according to claim 1, further comprising:
   an insulating layer selectively provided between the first insulating wall and the horizontal portion of the channel body layer,
   wherein the first insulating wall contacts the insulating layer at an end on the semiconductor layer side.

* * * * *